US011605355B2

United States Patent
Cho et al.

(10) Patent No.: US 11,605,355 B2
(45) Date of Patent: Mar. 14, 2023

(54) ORGANIC LIGHT EMITTING DISPLAY DEVICE AND METHOD OF TESTING THE SAME

(71) Applicant: Samsung Display Co., Ltd., Yongin-si (KR)

(72) Inventors: Dae Youn Cho, Yongin-si (KR); Sang Kil Kim, Yongin-si (KR); Hyo Jung Kim, Yongin-si (KR); Jong Woo Park, Yongin-si (KR); Dong Gi Ahn, Yongin-si (KR); Jong Won Lee, Yongin-si (KR); Ju Hee Lee, Yongin-si (KR); Young Tae Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/372,929

(22) Filed: Jul. 12, 2021

(65) Prior Publication Data

US 2021/0343248 A1 Nov. 4, 2021

Related U.S. Application Data

(62) Division of application No. 16/372,927, filed on Apr. 2, 2019, now Pat. No. 11,081,063.

(30) Foreign Application Priority Data

Apr. 3, 2018 (KR) .......................... 10-2018-0038884

(51) Int. Cl.
*G09G 3/00* (2006.01)
*G09G 3/3291* (2016.01)
(Continued)

(52) U.S. Cl.
CPC ........... *G09G 3/3291* (2013.01); *G09G 3/006* (2013.01); *G09G 3/2003* (2013.01);
(Continued)

(58) Field of Classification Search
CPC .... G09G 3/3291; G09G 3/006; G09G 3/2003; G09G 3/3233; G09G 3/3266;
(Continued)

(56) References Cited

U.S. PATENT DOCUMENTS 8,520,158 B2  8/2013  Lee et al.
8,749,262 B2  6/2014  Jung et al.
(Continued)

FOREIGN PATENT DOCUMENTS

KR  10-2014-0094231  7/2014

*Primary Examiner* — Adam R. Giesy
(74) *Attorney, Agent, or Firm* — Kile Park Reed & Houtteman PLLC

(57) ABSTRACT

An organic light emitting display device includes scan lines arranged in horizontal lines, data lines intersecting the scan lines, a pixel array including pixels coupled to the scan lines and the data lines, the pixels including at least first color pixels, a panel tester including switching elements coupled to first ends of the data lines, the switching elements including at least first and second switching elements, and a first line coupled to the first switching elements and a second line coupled to the second switching elements. Data lines of K-th to (K+L)-th (where K and L are natural numbers) first color pixels arranged in a predetermined horizontal line are coupled to the first line through the first switching elements, and data lines of at least a part of remaining first color pixels arranged in the predetermined horizontal line are coupled to the second line through the second switching elements.

11 Claims, 14 Drawing Sheets

(51) Int. Cl.
   *G09G 3/3266* (2016.01)
   *G09G 3/3233* (2016.01)
   *G09G 3/20* (2006.01)
   *H01L 27/32* (2006.01)
   *H01L 51/50* (2006.01)

(52) U.S. Cl.
   CPC ......... *G09G 3/3233* (2013.01); *G09G 3/3266* (2013.01); *H01L 27/3276* (2013.01); *H01L 51/50* (2013.01); *G09G 2300/0426* (2013.01); *G09G 2300/0452* (2013.01); *H01L 2251/568* (2013.01)

(58) Field of Classification Search
   CPC ... G09G 2300/0426; G09G 2300/0452; G09G 2330/10; G09G 2320/043; H01L 27/3276; H01L 51/50; H01L 2251/568; H01L 51/0031; H01L 2251/56
   See application file for complete search history.

(56) References Cited

U.S. PATENT DOCUMENTS

| | | |
|---|---|---|
| 9,147,619 B2 | 9/2015 | Lee |
| 9,501,959 B2 | 11/2016 | Kim et al. |
| 9,595,213 B2 | 3/2017 | Kim |
| 9,716,111 B2 | 7/2017 | Son et al. |
| 9,748,520 B2 | 8/2017 | Yi et al. |
| 2012/0249499 A1 | 10/2012 | Takahashi et al. |
| 2014/0313235 A1* | 10/2014 | Park ................... G09G 3/3225 345/83 |
| 2018/0374422 A1* | 12/2018 | Fujikawa ............. G09G 3/3648 |
| 2019/0052872 A1* | 2/2019 | Shyshkin .................. G01J 1/32 |

\* cited by examiner

ORGANIC LIGHT EMITTING DISPLAY DEVICE AND METHOD OF TESTING THE SAME

CROSS-REFERENCE TO RELATED APPLICATION(S)

This is a divisional application of U.S. patent application Ser. No. 16/372,927, filed Apr. 2, 2019 (now issued as U.S. Pat. No. 11,081,063), the disclosure of which is incorporated herein by reference in its entirety. U.S. patent application Ser. No. 16/372,927 claims priority to and benefit of Korean Patent Application No. 10-2018-0038884 under 35 U.S.C. § 119, filed on Apr. 3, 2018, in the Korean Intellectual Property Office, the entire contents of which are incorporated herein by reference.

BACKGROUND

1. Field

Embodiments relate to an organic light emitting display device and a method of testing the organic light emitting display device.

2. Description of the Related Art

An organic light emitting display device displays an image using an organic light emitting diode which is a kind of self-emissive device. Then organic light emitting display device has attracted attention as a next-generation display device owing to excellent luminance and color purity.

SUMMARY

Embodiments are directed to an organic light emitting display device, including scan lines arranged in respective horizontal lines, data lines configured to intersect the scan lines, a pixel array, the pixel array including pixels coupled to the scan lines and the data lines, the pixels including at least first color pixels, a panel tester, the panel tester including switching elements coupled to first ends of the data lines, the switching elements including at least first and second switching elements, and a first line coupled to the first switching elements and a second line coupled to the second switching elements. Data lines of K-th to (K+L)-th (where K and L are natural numbers) first color pixels arranged in a predetermined horizontal line may be coupled to the first line through the first switching elements, and data lines of at least a part of remaining first color pixels arranged in the predetermined horizontal line may be coupled to the second line through the second switching elements.

Different numbers of first color pixels may be respectively coupled to the first and second lines.

The number of first color pixels coupled to the first line may be less than the number of first color pixels coupled to the second line, and a thickness of the first line may be less than a thickness of the second line.

The pixel array may include a first zone including a part of first color pixels arranged in a plurality of horizontal lines including the predetermined horizontal line; and a second zone including remaining first color pixels arranged in the plurality of horizontal lines.

Data lines coupled to first color pixels present in the first zone may be coupled in common to the first line through the first switching elements, and data lines coupled to first color pixels present in the second zone may be coupled in common to the second line through the second switching elements.

The organic light emitting display device may further include a first pad coupled to the first line, and a second pad coupled to the second line.

The organic light emitting display device may further include second and third color pixels arranged in the pixel array, third to sixth switching elements included in the panel tester and coupled to data lines of the second and third color pixels, and third to sixth lines coupled to the third to sixth switching elements, respectively.

Data lines of K-th to (K+L)-th second and third color pixels arranged in the predetermined horizontal line may be coupled to the third and fifth lines through the third and fifth switching elements, respectively, and remaining second and third color pixels arranged in the horizontal line may be coupled to the fourth and sixth lines through the fourth and sixth switching elements, respectively.

The organic light emitting display device may further include third to sixth pads coupled to the third to sixth lines, respectively.

The organic light emitting display device may further include a seventh line coupled in common to control electrodes of the first to sixth switching elements, and a seventh pad coupled to the seventh line.

The pixel array may include a plurality of pixel column groups that are repeatedly arranged, and each of the pixel column groups may include a first pixel column in which the first and third color pixels are alternately arranged along an extension direction of the data lines, a second pixel column arranged adjacent to the first pixel column and configured such that the second color pixels are successively arranged, a third pixel column arranged adjacent to the second pixel column and configured such that the first and third color pixels are alternately arranged in a sequence opposite to that of the first pixel column, and a fourth pixel column arranged adjacent to the third pixel column and configured such that the second color pixels are successively arranged.

The organic light emitting display device may further include a first test control line coupled in common to control electrodes of first and second switching elements coupled to the first pixel column and to control electrodes of fifth and sixth switching elements coupled to the third pixel column, a second test control line coupled in common to control electrodes of fifth and sixth switching elements coupled to the first pixel column and to control electrodes of first and second switching elements coupled to the third pixel column, and a third test control line coupled in common to control electrodes of third and fourth switching elements coupled to the second and fourth pixel columns.

Respective thicknesses of the first, second, fifth and sixth lines may be greater than respective thicknesses of the third and fourth lines.

Embodiments are also directed to a method of testing an organic light emitting display device, the method including displaying a predetermined test pattern by driving pixels present in first and second zones at different grayscale levels during a predetermined test period, measuring luminance values of the first and second zones while driving the pixels present in the first and second zones at an identical grayscale level, and detecting degradation characteristics of an organic light emitting diode using the luminance values of the first and second zones.

During a period in which the test pattern is displayed, a test signal having a first grayscale level may be supplied to the pixels present in the first zone, and a test signal having a second grayscale level may be supplied to the pixels present in the second zone.

The first grayscale level may be set to a black grayscale level, and the second grayscale level may be set to a white grayscale level.

During each horizontal period, in which the pixels present in the first and second zones are selected together, in a period in which the test pattern is displayed, a test signal having a first grayscale level may be supplied to first color pixels present in the first zone through a first line and first switching elements, and a test signal having a second grayscale level may be supplied to first color pixels present in the second zone through a second line and second switching elements during the horizontal periods.

During a period in which the test pattern is displayed, all of the pixels present in the first zone may be caused not to emit light, and all of the pixels present in the second zone may be caused to emit light.

BRIEF DESCRIPTION OF THE DRAWINGS

Features will become apparent to those of skill in the art by describing in detail example embodiments with reference to the attached drawings in which.

DETAILED DESCRIPTION

Figure 1:
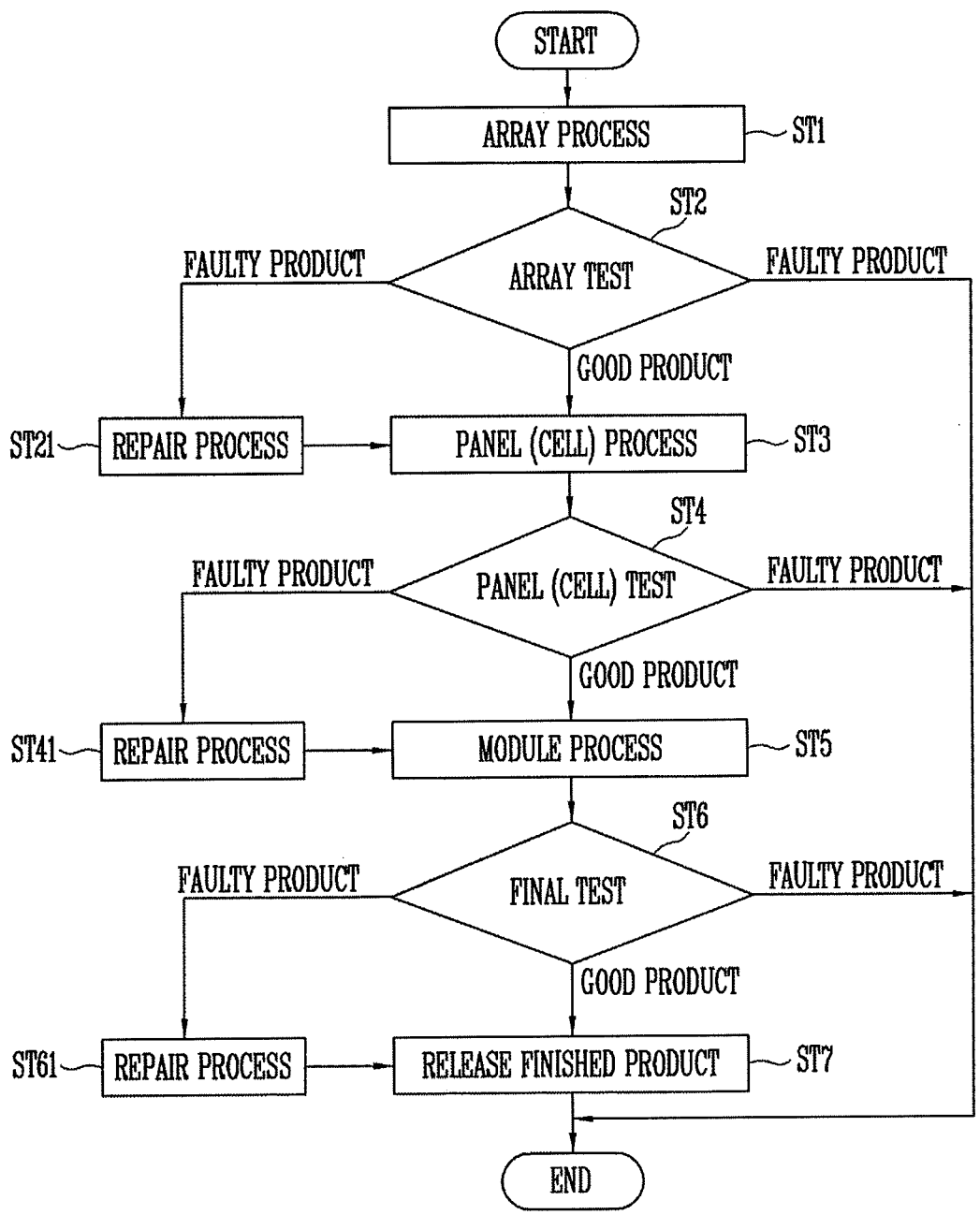
FIG. 1 illustrates a diagram of a method of manufacturing an organic light emitting display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

It will be understood that when an element is referred to as being "coupled" to another element, it may be directly coupled to the element or may be coupled thereto with other elements interposed therebetween.

Some elements which are not directly related to the features of the present disclosure in the drawings may be omitted to clearly explain the present disclosure.

FIG. 1 illustrates a diagram of a method of manufacturing an organic light emitting display device according to an example embodiment. An example embodiment in which an organic light emitting display device is manufactured through three test stages is illustrated in FIG. 1, but one or more the test stages illustrated in FIG. 1 may be omitted or merged with other test stages or, alternatively, an additional test stage may be added.

Referring to FIG. 1, an array process ST1 for forming a pixel circuit array on a substrate is performed first. In an example embodiment, at least one driver circuit may be formed together with the pixel circuit array in the array process ST1. For example, in the array process ST1, the pixel circuit array and a scan driver may be formed together.

In an example embodiment, the array process ST1 may be performed on a mother substrate required to manufacture a plurality of panels at one time. In an example embodiment, each pixel circuit may be implemented as a general pixel circuit having various structures. For example, each pixel circuit may include two or more thin film transistors and one or more capacitors.

When the array process ST1 is completed, an array test ST2 for detecting whether a fault occurs in the pixel circuit array may be conducted. In the array test ST2, whether each thin film transistor is normally operated may be checked. A pixel circuit determined to be a faulty product (pixel circuit) in the array test ST2 may go through a repair process ST21, or may be processed to stop the current process without proceeding to a next process if the faulty pixel circuit is incapable of being repaired.

A panel process (or cell process) ST3 for forming an organic light emitting diode in each pixel area may be performed on a pixel circuit array that is determined to be a good product in the array test ST2 or the repair of which has been completed. For example, an organic light emitting diode coupled to each pixel circuit may be formed in the panel process ST3. The organic light emitting diode may include a first electrode (e.g., anode electrode), an organic light emitting layer, and a second electrode (e.g., cathode electrode), and may be operated as a light source of the corresponding pixel.

When the panel process ST3 is completed, a panel test (or cell test) ST4 may be conducted. The panel test ST4 may include a lighting test, a leakage current test, and/or an aging test for the panel. Further, in the present example embodiment, the panel test ST4 may include a characteristic test (e.g., lifespan evaluation or the like) for the organic light emitting diode. In an example embodiment, the panel test ST4 may be conducted for each panel (cell) on the mother substrate or may be performed for each individually separated panel through at least one scribing process. A panel determined to be a faulty panel in the panel test ST4 may go through a repair process ST41, or may be processed to stop the current process without proceeding to a next process when the faulty panel is incapable of being repaired.

A final test (or module test) ST6 may be conducted through a module process ST5 on a panel which is determined to be a good product in the panel test ST4 or the repair of which has been completed. A finished product and a faulty product may be sorted through the final test ST6. A module determined to be a faulty product (module) in the final test ST6 may undergo a repair process ST61 or may terminate the current process when the faulty module is incapable of being repaired.

A module that is determined to be a good product in the final test ST6 or the repair of which has been completed may be released as a finished product in a release process ST7.

As described above, the organic light emitting display device may be manufactured while going through several test stages. Accordingly, faults occurring in the manufacturing process may be detected early. A faulty panel or module may be repaired to improve manufacturing yield, and a panel or module incapable of being repaired may be processed to stop the current process without executing a next process, thus reducing the waste of manufacturing time and costs. Accordingly, the manufacturing efficiency of the organic light emitting display device may be improved.

In an example embodiment, in the stage of manufacturing the organic light emitting display device, characteristic variations attributable to the degradation of an organic light emitting diode, for example, degradation characteristics (or lifespan characteristics), may be detected. For example, in the panel test stage ST4, pixels may be divided into a plurality of groups, and pixels in respective groups may be continuously driven at different grayscale levels (or luminance values) for a predetermined period of time, thus allowing respective groups to exhibit different lifespans of organic light emitting diodes. Thereafter, the actual luminance values of the pixels of respective groups or areas in which the pixels of respective groups are arranged may be measured while the pixels of respective groups are driven at the same grayscale level (or luminance value), and the degradation characteristics of organic light emitting diodes may be detected based on the actual luminance values. Accordingly, additional factors that may influence luminance may be excluded, and the degradation characteristics of organic light emitting diodes may be effectively detected.

As described above, when the degradation characteristics of organic light emitting diodes are detected before the module process ST5 is performed, the manufacturing efficiency of the organic light emitting display device may be improved. For example, the degradation characteristics of organic light emitting diodes may be detected during a period in which individual panels are transferred for the module process, and thus a manufacturing time may be shortened. The detected degradation characteristics may be used as information related to panel characteristics or may be used for degradation compensation or the like.

Figure 2:
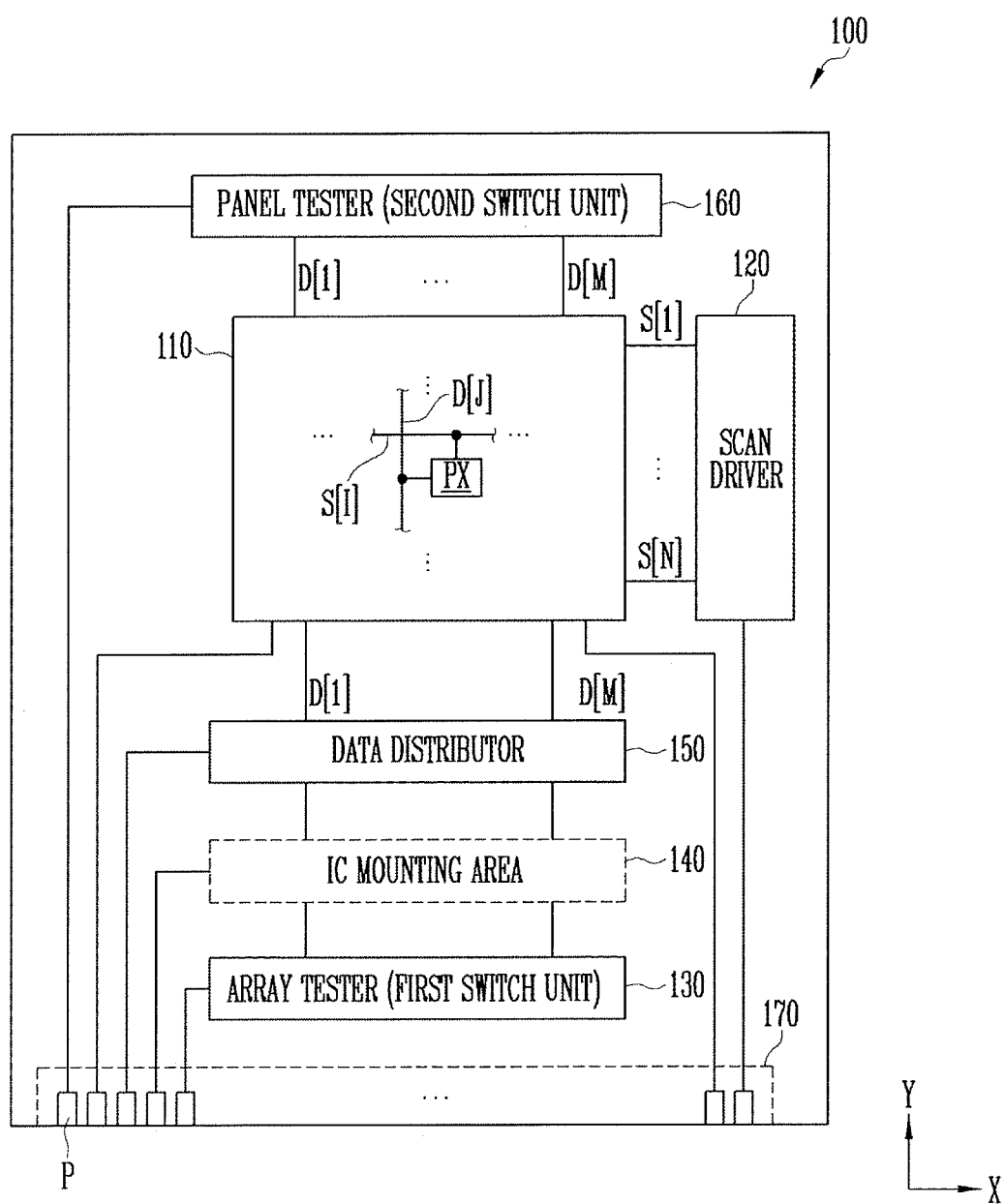
FIG. 2 illustrates a diagram of a panel of an organic light emitting display device according to an example embodiment.

FIG. 2 illustrates a diagram of a panel of an organic light emitting display device according to an example embodiment, and illustrates a cell-unit panel before an IC, such as a data driver, is mounted. A panel may be provided with two testers is illustrated in FIG. 2, the present disclosure is not limited thereto, or one or more of the testers illustrated in FIG. 2 may be omitted or separated, or an additional tester may be added.

Referring to FIG. 2, a panel 100 according to an example embodiment may include a pixel array 110, a scan driver 120, an array tester 130, an IC mounting area 140, a data distributor 150, a panel tester 160, and a pad unit 170.

The pixel array 110 may include a plurality of scan lines S[1] to S[N] and data lines D[1] to D[M] that intersect each other, and a plurality of pixels PX that are coupled to the scan lines S[1] to S[N] and the data lines D[1] to D[M].

The scan lines S[1] to S[N] may extend along a first direction (e.g., X direction). Scan lines S[1] to S[N] may be sequentially arranged along a second direction (e.g., Y direction). Thus, at least one scan line may be arranged in each horizontal line of the pixel array 110. For example, at least an I-th (where I is a natural number) scan line S[I] may be arranged in an I-th horizontal line of the pixel array 110.

The data lines D[1] to D[M] may extend along the second direction to intersect the scan lines S[1] to S[N]. Data lines D[1] to D[M] may be sequentially arranged along the first direction. Thus, at least one data line may be arranged in each vertical line of the pixel array 110. For example, a J-th (where J is a natural number) data line D[J] may be arranged in a J-th vertical line of the pixel array 110.

The pixels PX may be arranged in respective pixel areas defined by the scan lines S[1] to S[N] and the data lines D[1] to D[M], and may then be coupled to respective scan lines and data lines. For example, a pixel PX arranged in the I-th horizontal line and the J-th vertical line may be coupled to at least the I-th scan line S[I] and the J-th data line D[J]. When a scan signal is supplied from the corresponding scan line (e.g., the I-th scan line S[I]), each pixel PX may be selected and may be supplied with a data signal from the corresponding data line (e.g., the J-th data line D[J]), and may thus emit light having luminance corresponding to the data signal.

In an example embodiment, the pixels PX may include a plurality of pixel groups that emit light of different colors. For example, the pixels PX may include first color pixels (e.g., red pixels), second color pixels (e.g., green pixels), and third color pixels (e.g., blue pixels). For this operation, each of the first color pixels may include a first color organic light emitting diode (e.g., red organic light emitting diode), each of the second color pixels may include a second color organic light emitting diode (e.g., green organic light emitting diode), and each of the third color pixels may include a third color organic light emitting diode (e.g., blue organic light emitting diode).

The scan driver 120 may be coupled to first ends of the scan lines S[1] to S[N]. The scan driver 120 may generate scan signals in response to a scan control signal supplied from outside (e.g., timing controller), and supply the scan signals to the scan lines S[1] to S[N]. For example, the scan driver 120 may sequentially supply scan signals to the scan lines S[1] to S[N] for each frame period.

An embodiment in which the scan driver 120 is formed and/or arranged on the panel 100 is illustrated in FIG. 2, but the scan driver 120 may be, for example, formed and/or mounted on the outside (e.g., on a flexible printed circuit board or the like) of the panel 100, and may then be coupled to the scan lines S[1] to S[N] through the pad unit 170.

The array tester 130 may be used for the array test ST2 described above with reference to FIG. 1 or the like. For this operation, the array tester 130 may include a plurality of switching elements for supplying array test signals to a pixel circuit array formed in the pixel array 110 during a period in which the array test ST2 is conducted.

In an example embodiment, the array tester 130 may remain turned off when the panel 100 is actually used. For example, the switching elements of the array tester 130 may continuously remain turned off, except for the period in which the array test ST2 is conducted. In this case, the array tester 130 may be maintained in the panel 100 in the form of a switch unit (e.g., first switch unit). In another example embodiment, the array tester 130 may be operated to perform a predetermined test even after the panel 100 is actually used.

A plurality of data pads coupled to the data lines D[1] to D[M] of the pixel array 110 are arranged in the IC mounting area 140. A data driver may be mounted in the IC mounting area 140. For example, in the module process ST5, described above with reference to FIG. 1, the data driver may be mounted in the IC mounting area 140. The data driver may generate data signals in response to image data and data control signals which are supplied from outside (e.g., timing controller), and may supply the data signals to the data lines D[1] to D[M]. In other embodiments, the data driver may be formed and/or mounted on the outside (e.g., on a flexible printed circuit board or the like) of the panel 100, and may then be coupled to the data lines D[1] to D[M] through the pad unit 170.

The data distributor 150 may be coupled to first ends of the data lines D[1] to D[M]. For example, the data distributor 150 may be coupled between data pads of the IC mounting area 140 and the data lines D[1] to D[M]. The data distributor 150, which is configured to reduce the size of an integrated circuit (IC) (e.g., data driver) mounted in the IC mounting area 140, may be implemented as, for example, a demultiplexer. The data distributor 150 may selectively supply data signals outputted from the data driver to the data lines D[1] to D[M]. Additionally, the data distributor 150 may also be used for the array test ST2. For example, the data distributor 150 may transfer array test signals, supplied from the array tester 130, to the data lines D[1] to D[M] during a period in which the array test ST2 is conducted. In other embodiments, the panel 100 may not be provided with the data distributor 150. When the data distributor 150 is omitted, the array tester 130 and/or the pad unit 170 may be directly coupled to the first ends of the data lines D[1] to D[M].

The panel tester 160 may be used for the panel test ST4 described above with reference to FIG. 1, or the like. For this, the panel tester 160 may include a plurality of switching elements for supplying predetermined panel test signals (e.g., lighting test signals) to the pixels PX during a period in which the panel test ST4 is conducted. For example, the panel tester 160 may be implemented as a lighting test circuit.

In an example embodiment, the panel tester 160 may remain turned off when the panel 100 is actually used. For example, the switching elements of the panel tester 160 may remain turned off, except for a period in which the panel test ST4 is conducted. Here, the panel tester 160 may be maintained in the panel 100 in the form of a switch unit (second switch unit). However, in an example embodiment, the panel tester 160 may be operated to conduct a predetermined test even after the panel 100 is actually used.

The pad unit 170 may include a plurality of pads P for transferring various types of signals and/or powers, which are externally supplied, into the panel 100. For convenience of description, although each component of the panel 100 and the pad unit 170 is illustrated as being coupled to each other through a single line and a single pad in FIG. 2, each component of the panel 100 and the pad unit 170 may be actually coupled to each other through a plurality of lines and a plurality of pads corresponding thereto.

The panel 100 according to the above-described embodiment may be provided with the array tester 130 and the panel tester 160, and thus the characteristics of the panel 100 itself may be effectively checked (or evaluated) before the module process ST5, described above with reference to FIG. 1, is performed. For example, at least whether a fault occurs in the pixel circuit array may be determined using the array tester 130, and a lighting test and/or a degradation test (or lifespan evaluation) for organic light emitting diodes may be conducted using the panel tester 160.

Figure 3:
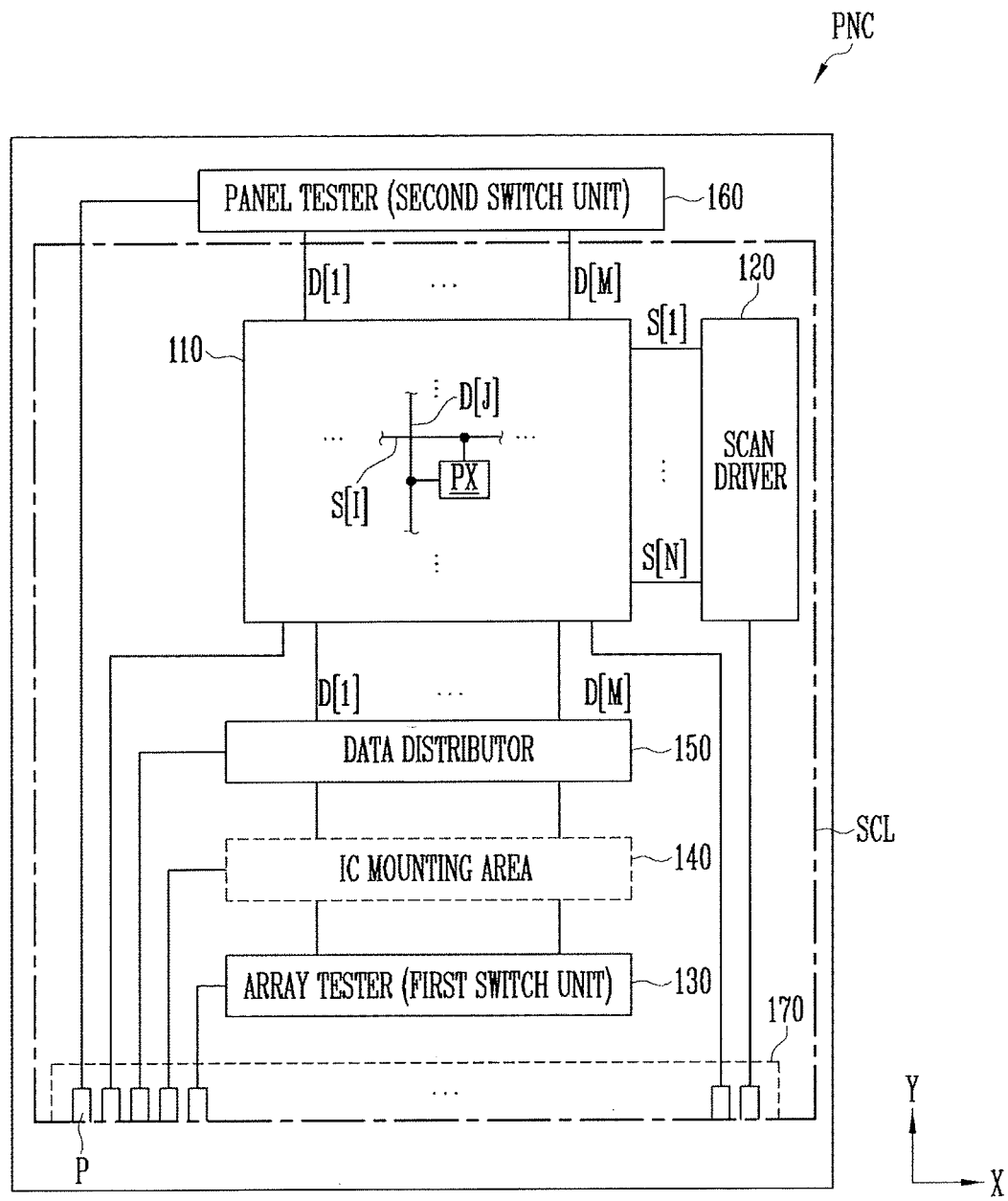
FIGS. 3 and 4 illustrate diagrams of a panel of an organic light emitting display device according to an example embodiment.
Figure 4:
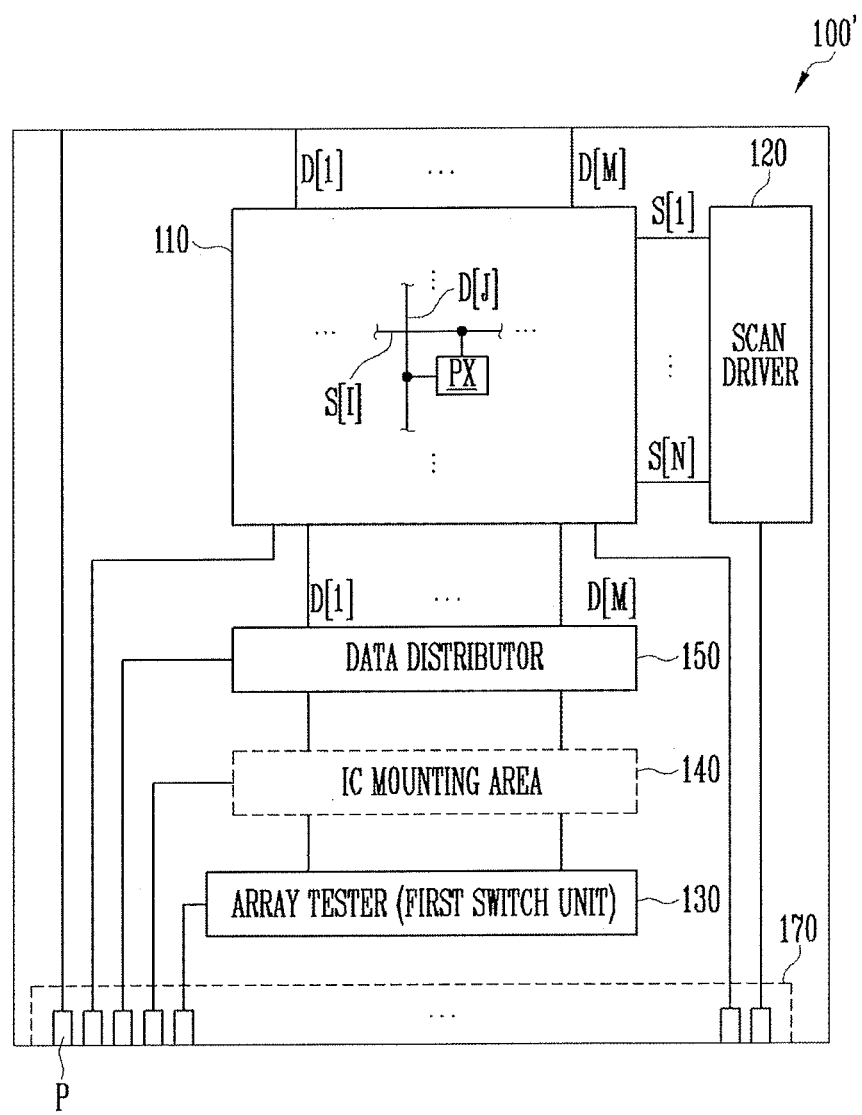

FIGS. 3 and 4 illustrate diagrams of a panel of an organic light emitting display device according to an example embodiment. In FIGS. 3 and 4, the same reference numerals are used to designate components similar or identical to those in the embodiment of FIG. 2, and a detailed description of the components will be omitted.

Referring to FIGS. 3 and 4, the panel tester 160 may be disposed outside of a panel 100' around a final scribing line SCL on a cell-unit panel (PNC) primarily separated (or partitioned) on a mother substrate. After the panel tester 160 is used for the panel test ST4, it may be separated from the panel 100' through a final scribing process. Thus, the panel tester 160 may be removed from the final panel 100' for which the scribing process is completely finished. In this case, the first ends of the data lines D[1] to D[M] may float, with the first ends being disconnected from a first edge of the panel 100'. In another example embodiment, the first ends of the data lines D[1] to D[M] may be coupled to predetermined pads P, and may then be supplied with a bias voltage or the like.

An embodiment in which pads P, coupled (or had been coupled) to the array tester 130 and the panel tester 160, and the array tester 130 remain on the panel 100' is illustrated in FIGS. 3 and 4, but one or more of the array tester 130, at least one pad P coupled to the array tester 130, and/or at least one pad P coupled to the panel tester 160 may be disposed outside of the panel 100' around the scribing line SCL, and may then be removed from the final panel 100'.

Figure 5:
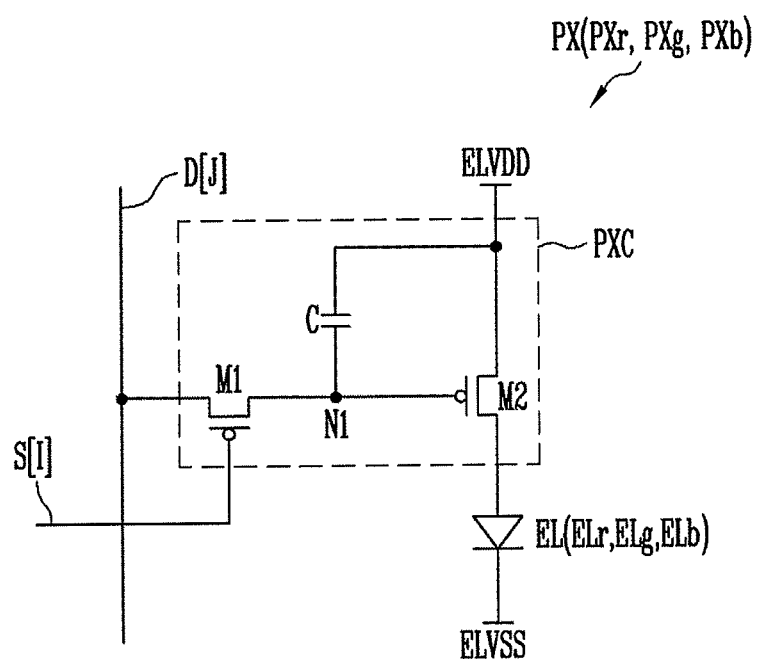
FIG. 5 illustrates a diagram of a pixel according to an example embodiment.

FIG. 5 illustrates a diagram of a pixel according to an example embodiment. As an example, in FIG. 5, an arbitrary pixel provided in the panel 100 of FIG. 2, for example, a pixel PX coupled to an I-th scan line S[I] and a J-th data line D[J], is illustrated. The structure of the pixel PX may be that of the embodiment illustrated in FIG. 5 or of another suitable structure.

Referring to FIG. 5, the pixel PX according to the present example embodiment may include an organic light emitting diode EL and a pixel circuit PXC coupled thereto. In an example embodiment, another type of light emitting element may be used in place of the organic light emitting diode EL.

The organic light emitting diode EL may be coupled between a first power source ELVDD and a second power source ELVSS having different potentials. For example, the first power source ELVDD may be set to a high-potential power source, and the second power source ELVSS may be set to a low-potential power source. A potential difference between the first power source ELVDD and the second power source ELVSS, that is, a voltage applied therebetween, may be greater than the threshold voltage of the organic light emitting diode EL.

In an example embodiment, the organic light emitting diode EL may be coupled to the first or second power source ELVDD or ELVSS via the pixel circuit PXC. For example, the organic light emitting diode EL may be coupled to the first power source ELVDD via the pixel circuit PXC. The organic light emitting diode EL may emit light at luminance corresponding to a driving current supplied from the pixel circuit PXC.

The pixel circuit PXC may be coupled between the first power source ELVDD and the organic light emitting diode EL to control a current flowing into the organic light emitting diode EL. In another example embodiment, the pixel circuit PXC may be coupled between the organic light emitting diode EL and the second power source ELVSS.

In an example embodiment, the pixel circuit PXC may include first and second transistors M1 and M2 and a capacitor C. In an example embodiment, both the first and second transistors M1 and M2 may be, for example, P-type transistors. For example, in other embodiments, at least one of the first and second transistors M1 and M2 may be implemented as an N-type transistor.

In the present example embodiment, the first transistor (i.e., switching transistor) M1 is coupled between the corresponding data line D[J] and a first node N1. Also, a gate electrode of the first transistor M1 is coupled to the corresponding scan line S[I]. The first transistor M1 may be turned on when a scan signal is supplied through the scan line S[I], thus electrically coupling the data line D[J] to the first node N1. Therefore, when the first transistor M1 is turned on, a data signal supplied to the data line D[J] is transferred to the first node N1.

In the present example embodiment, the second transistor (i.e., driving transistor) M2 is coupled between the first power source ELVDD and the organic light emitting diode EL. Further, a gate electrode of the second transistor M2 is coupled to the first node N1. The second transistor M2 controls a driving current flowing into the organic light emitting diode EL in response to the voltage of the first node N1. For example, the second transistor M2 may control the supply/non-supply of the driving current and/or the magnitude of the driving current in response to the voltage of the first node N1.

In the present example embodiment, the capacitor C is coupled between the first power source ELVDD and the first node N1. The capacitor C stores a voltage corresponding to a data signal supplied to the first node N1, and maintains the stored voltage until a data signal corresponding to a next frame is supplied.

In the present example embodiment, the above-described pixel PX may be any one of a red pixel PXr, a green pixel PXg, and a blue pixel PXb. In this case, the organic light emitting diode EL may be any one of a red organic light emitting diode ELr, a green organic light emitting diode ELg, and a blue organic light emitting diode ELb.

FIGS. 6A to 6D illustrate examples of a test pattern according to an example embodiment. In detail, FIGS. 6A to 6D illustrate different examples related to a test pattern displayed on a pixel array 110 during a predetermined test period, for example, a period for an organic light emitting diode EL degradation test (or lifespan evaluation) which can be conducted in the panel test ST4 of FIG. 1. Further, FIG. 7 illustrates a diagram of a portion of the pixel array illustrated in FIG. 6A.

Figure 6A:
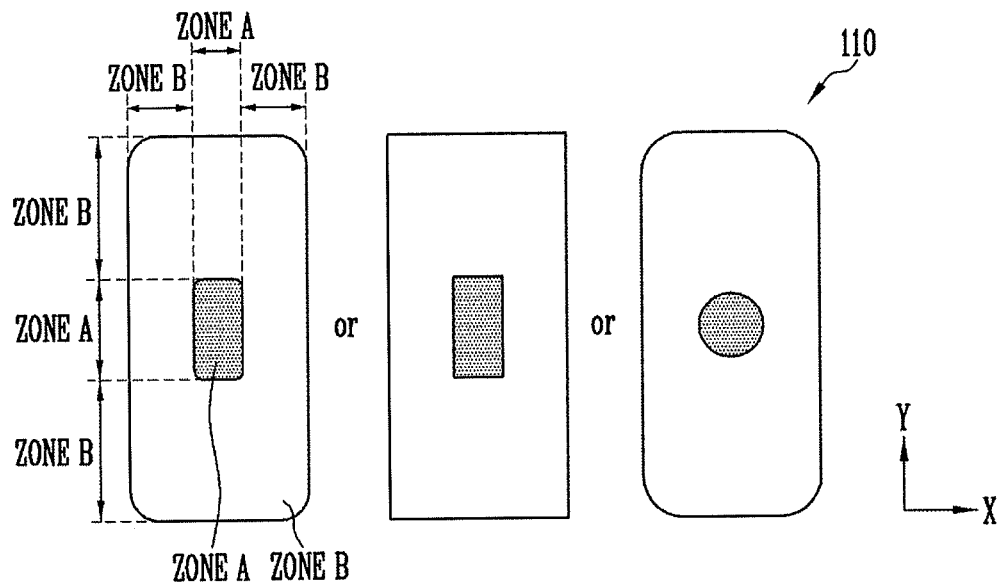
FIGS. 6A to 6D illustrate diagrams of examples of a test pattern according to an example embodiment.
Figure 7:
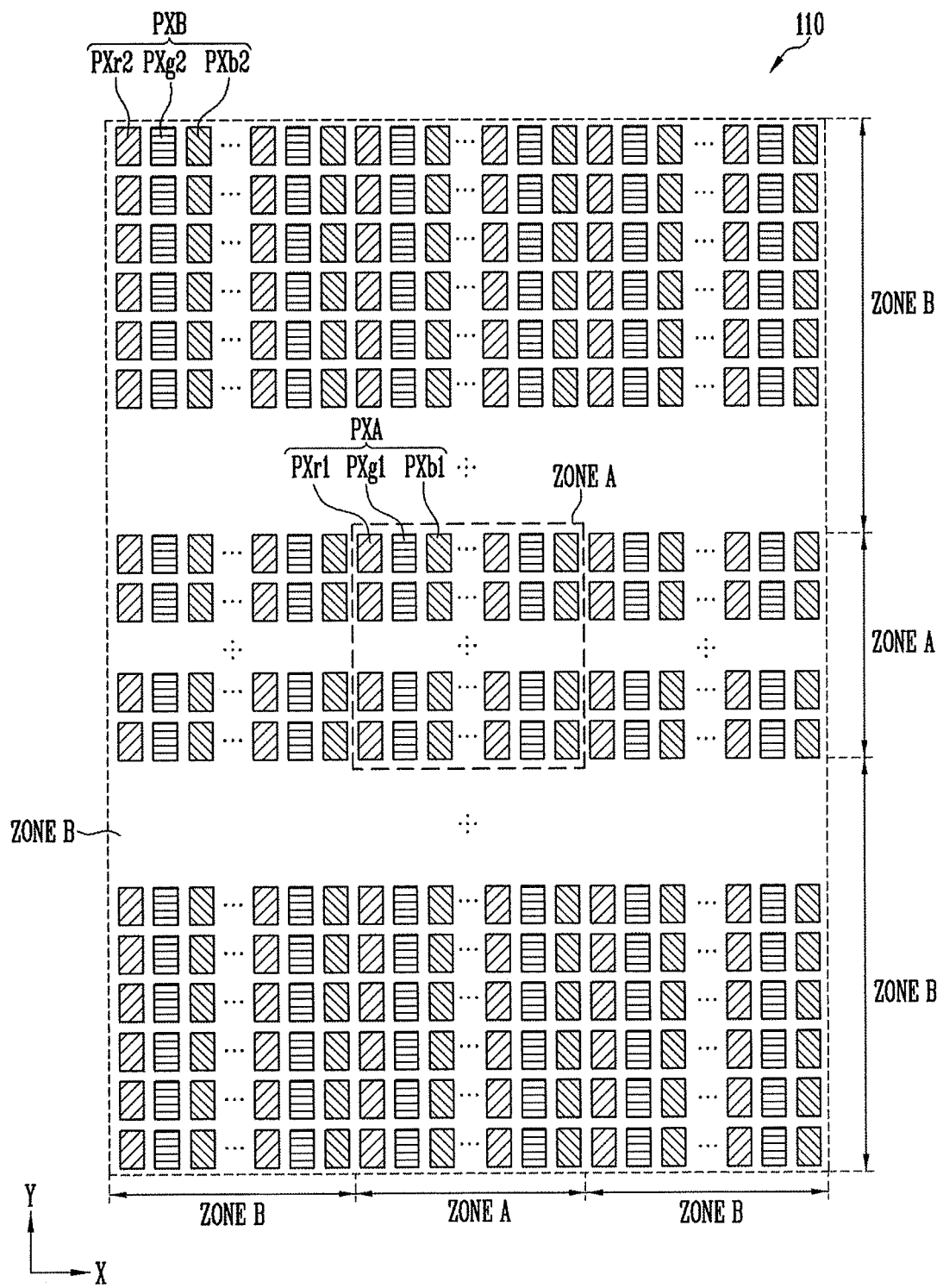
FIG. 7 illustrates a diagram of a portion of a pixel array illustrated in FIG. 6A.

First, referring to FIGS. 6A and 7, during a predetermined test period, for example, a period for an organic light emitting diode EL degradation test (or lifespan evaluation) which may be conducted in the panel test ST4 of FIG. 1, the pixel array 110 may be divided into at least two zones ZONE A and ZONE B, and may drive the zones ZONE A and ZONE B at different grayscale levels. In an example embodiment, the pixel array 110 may be divided into the first zone ZONE A and the second zone ZONE B both in a first direction (e.g., X direction) and in a second direction (e.g., Y direction). For example, a central area of the pixel array 110 may be set to the first zone ZONE A, and the remaining area of the pixel array 110 enclosing the first zone ZONE A may be set to the second zone ZONE B.

In an example embodiment, some of pixels PX (hereinafter referred to as "first pixels PXA") arranged in each horizontal line passing through the first zone ZONE A may be disposed in the first zone ZONE A, and others of the pixels PX (hereinafter referred to as "second pixels PXB") arranged in the horizontal line may be disposed in the second zone ZONE B. Thus, in the present example embodiment, the pixels PX arranged in at least one horizontal line are divided into a plurality of groups, and pixels PXA and PXB of respective groups are disposed in the first zone ZONE A and the second zone ZONE B, respectively.

Figure 6B:
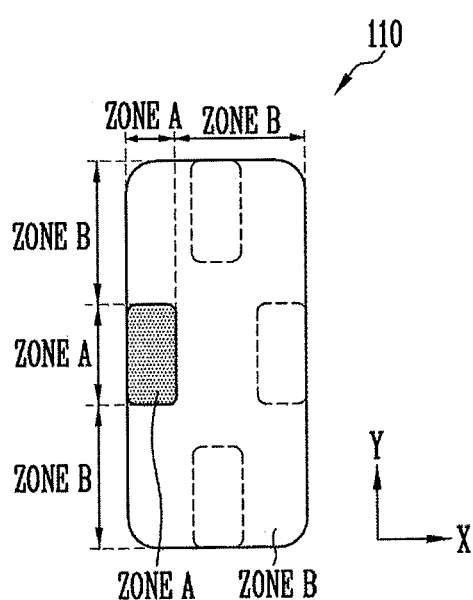
Figure 6C:
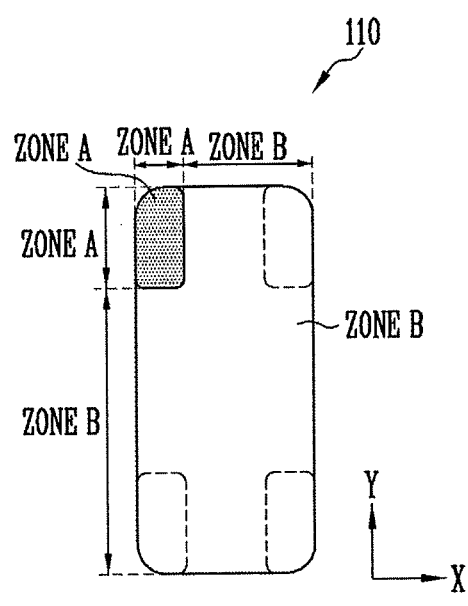
Figure 6D:
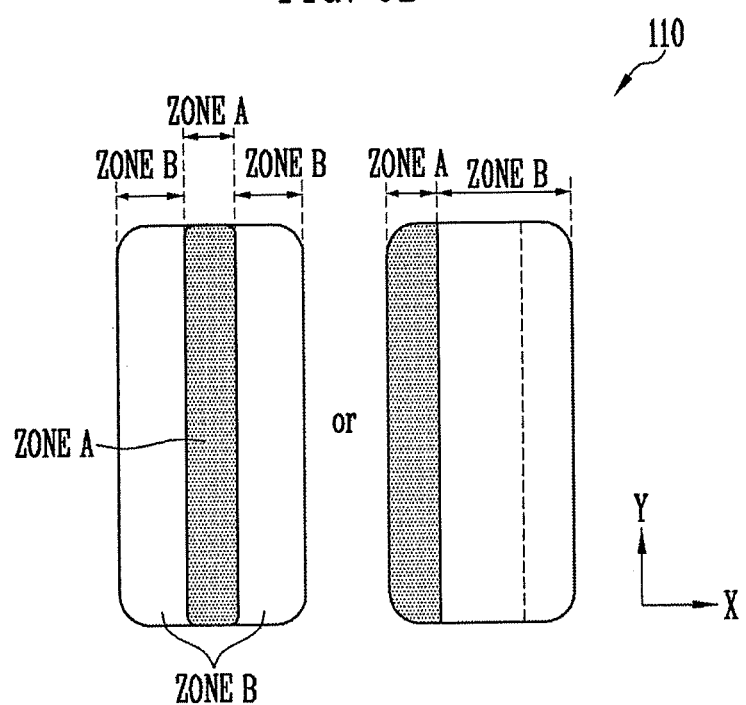

Respective sizes (or areas) and shapes of the zones ZONE A and ZONE B constituting the pixel array 110, and/or the numbers of zones ZONE A and ZONE B are not especially limited, and may be changed in various manners. In an example embodiment, as illustrated in FIG. 6B, the first zone ZONE A may be arranged to be biased towards any one side of the pixel array 110. In another implementation, as illustrated in FIG. 6C, the first zone ZONE A may be arranged to be biased towards any one corner of the pixel array 110. In another implementation, as illustrated in FIG. 6D, the pixel array 110 may be divided into a plurality of zones ZONE A and ZONE B only in a first direction (e.g., X direction).

In an example embodiment, for a predetermined test period, the first pixels PXA and the second pixels PXB may be supplied with test signals having different grayscale levels, and may then represent different luminance values. For example, during the test period, the first pixels PXA may be continuously supplied with test signals having a first grayscale level through respective data lines, and the second pixels PXB may be continuously supplied with test signals having a second grayscale level through respective data lines. For example, the first grayscale level may be set to a black grayscale level, and the second grayscale level may be set to a white grayscale level. In this case, during the test period, respective organic light emitting diodes EL of the first pixels PXA may be maintained in a non-emissive state, and respective organic light emitting diodes EL of the second pixels PXB may be maintained in an emissive state in which light is emitted at the maximum luminance corresponding to the highest grayscale level.

In this way, during the test period, when the first pixels PXA and the second pixels PXB continuously represent different luminance values, the organic light emitting diodes EL of the first pixels PXA and the second pixels PXB may be degraded to different degrees. Thus, differences between the lifespans of the first pixels PXA and the second pixels PXB may be evaluated. For example, in the present example embodiment, by setting the difference between the luminance values of the first pixels PXA and the second pixels PXB to the maximum during the test period, the degradation characteristics of the organic light emitting diodes EL may be effectively detected by efficiently utilizing a limited test time.

For example, in the present example embodiment, the pixel array 110 is divided into at least two zones ZONE A and ZONE B in at least a first direction (i.e., X direction in which individual horizontal lines extend), and drives the pixels PXA and PXB in respective zones ZONE A and ZONE B at different grayscale levels for a predetermined test time. Accordingly, additional factors that may influence the luminance of the pixels PXA and PXB (e.g., voltage drop differences caused by an RC delay) may be maximally excluded, and characteristic variations attributable to the degradation of the organic light emitting diodes EL may be more precisely detected.

Figure 8:
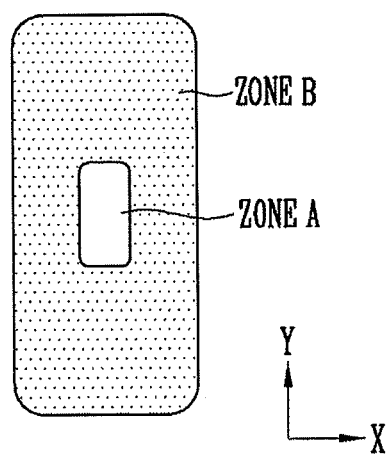
FIG. 8 illustrates a diagram of luminance differences occurring when pixels are caused to emit light at the same grayscale level immediately after a predetermined test pattern is displayed.

FIG. 8 illustrates a diagram of luminance differences occurring when all pixels are caused to emit light at the same grayscale level immediately after a predetermined test pattern is displayed. In an example, in FIG. 8, luminance differences corresponding to the test pattern of FIG. 6A are illustrated.

Referring to FIG. 8, when all of the first and second pixels PXA and PXB in first and second zones ZONE A and ZONE B are caused to emit light at the same grayscale level immediately after a predetermined test pattern is displayed, luminance values (i.e., respective brightness values of the first and second pixels PXA and PXB and/or the average brightness of each of the first and second zones ZONE A and ZONE B), which are actually represented by the first and second pixels PXA and PXB, may vary. For example, degradation may not occur in the first pixels PXA which are continuously maintained in a non-emissive state for a predetermined period of time to represent a black grayscale level, and thus the first pixels PXA may present a relatively high luminance. In contrast, degradation may occur in the second pixels PXB which are continuously maintained in an emissive state for the same period of time to represent a white grayscale level, and thus the second pixels PXB may present a relatively low luminance.

When the degradation characteristics of the organic light emitting diodes EL are detected by exploiting (e.g., comparing) the actually measured luminance values of the first and second pixels PXA and PXB, additional factors (e.g., variations in the characteristics of thin film transistors and/or RC delay) that may influence respective luminance values of the first and second pixels PXA and PXB may be maximally excluded, and the degradation characteristics of organic light emitting diodes EL may be more precisely detected.

Figure 9:
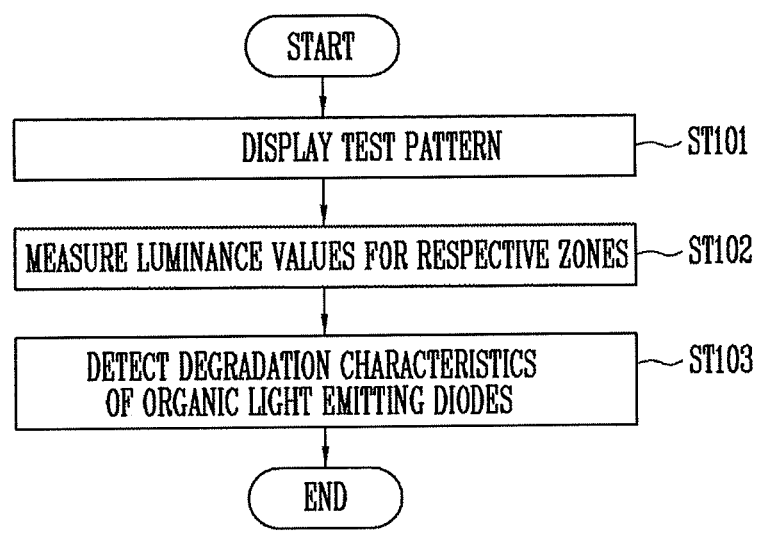
FIG. 9 illustrates a diagram of a panel test method according to an example embodiment.

FIG. 9 illustrates a diagram of a panel test method according to an example embodiment. For example, in FIG. 9, a panel test method (or a lifespan evaluation method) for detecting the degradation characteristics of an organic light emitting diode EL is illustrated.

In the present example embodiment, referring to FIG. 9, a test pattern is displayed at operation ST101. For example, a predetermined test pattern may be displayed by driving first and second pixels PXA and PXB arranged in first and second zones ZONE A and ZONE B at different grayscale levels for a predetermined test time (e.g., about 240 hours). For this operation, test signals having first and second grayscale levels may be supplied to the first and second pixels PXA and PXB through different lines for the test time.

When the display of the test pattern at operation ST101 is completed, luminance values for respective zones are measured at operation ST102. For example, the luminance values (e.g., average luminance values) of the first and second zones ZONE A and ZONE B may be measured while the first and second zones ZONE A and ZONE B are driven at the same grayscale level. For example, the luminance values of the first and second pixels PXA and PXB may be measured while the first and second pixels PXA and PXB are individually driven at the white grayscale level.

When the measurement of the luminance values for respective zones at operation ST102 is completed, the degradation characteristics of organic light emitting diodes EL are detected at operation ST103. For example, the degradation characteristics of organic light emitting diodes may be detected using the luminance values of the first and second zones ZONE A and ZONE B, and the lifespan evaluation (or lifespan prediction) of the panel 100 may be carried out based on the degradation characteristics.

Figure 10:
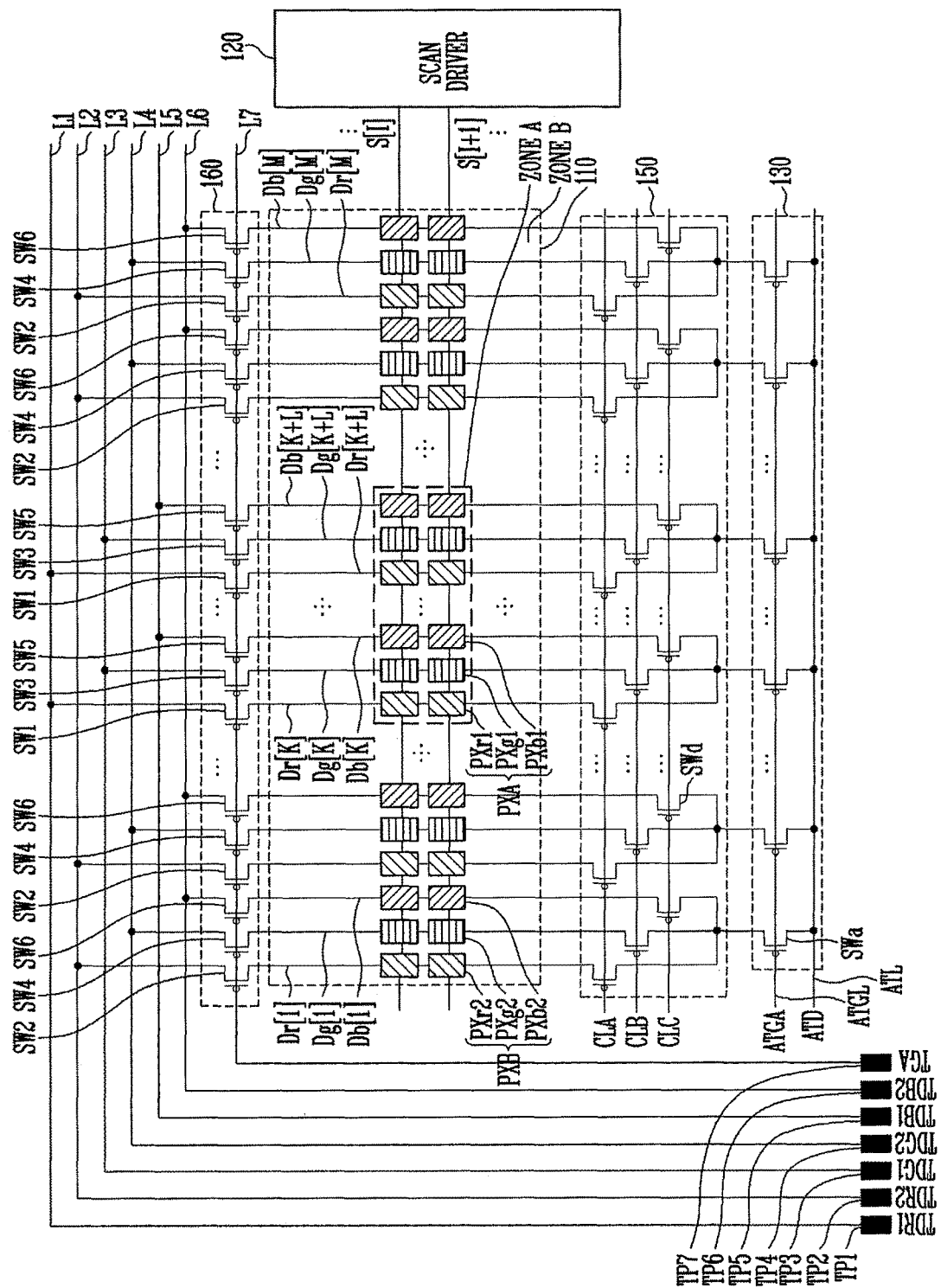
FIG. 10 illustrates a diagram of a pixel array and testers according to an example embodiment.

FIG. 10 illustrates a diagram of a pixel array and testers according to an example embodiment. In an example embodiment, the pixel array 110 and the testers 130 and 160 of FIG. 10 may be applied to the panel 100 of FIG. 2. In FIG. 10, the same reference numerals are used to designate components similar or identical to those in FIG. 2, and a detailed description of the components will be omitted.

Referring to FIG. 10, the pixel array 110 may include a plurality of first and second pixels PXA and PXB which are arranged as a stripe, although the pixel array 110 may have a various structures.

In an example embodiment, the first pixels PXA may be successively arranged along at least a first direction in the first zone ZONE A. For example, when an I-th horizontal line is arranged to pass through the first zone ZONE A, the first pixels PXA may include K-th to (K+L)-th (where K and L are natural numbers) red, green, and blue pixels (hereinafter referred to as "first red pixels PXr1", "first green pixels PXg1", and "first blue pixels PXb1") which are successively arranged in the i-th horizontal line. Further, the second pixels PXB may include remaining pixels arranged in the I-th horizontal line, for example, first to (K−1)-th and/or (K+L+1)-th to M-th (where M is a natural number greater than K+L+1) red, green, and blue pixels (hereinafter referred to as "second red pixels PXr2", "second green pixels PXg2", and "second blue pixels PXb2").

Further, when the first zone ZONE A includes a plurality of horizontal lines, the first pixels PXA may be successively arranged along first and second directions. For example, the first pixels PXA may include K-th to (K+L)-th (where K and L are natural numbers) red pixels PXr1, green pixels PXg1, and blue pixels PXb1 which are successively arranged in the I-th horizontal line, and K-th to (K+L)-th red pixels PXr1, green pixels PXg1, and blue pixels PXb1 which are successively arranged in an (I+1)-th horizontal line. Further, the second pixels PXB may include first to (K−1)-th and/or (K+L+1)-th to M-th (where M is a natural number greater than K+L+1) red pixels PXr2, green pixels PXg2, and blue pixels PXb2 which are arranged in each of the I-th and (I+1)-th horizontal lines. In FIG. 10, only two horizontal lines, for example, I-th and (I+1)-th horizontal lines, are illustrated as being arranged in the first zone ZONE A, but the number of horizontal lines arranged in the first zone ZONE A may be variously changed to one or more.

The array tester 130 may be coupled to first ends of data lines (e.g., Dr[1] to Dr[M], Dg[1] to Dg[M], and Db[1] to Db[M]). The array tester 130 may include a plurality of switching elements SWa for supplying array test signals to the data lines Dr[1] to Dr[M], Dg[1] to Dg[M], and Db[1] to Db[M] during a period in which an array test ST2 is conducted. The switching elements SWa may be coupled between one or more different data lines and an array test line ATL, and the control electrodes (e.g., gate electrodes) of the switching elements SWa may be coupled to an array test control line ATGL. An embodiment in which the switching elements SWa are coupled in common to one array test line ATL is illustrated in FIG. 10, but in other embodiments, at least two array test signal lines ATL may be provided, and each of the switching elements SWa may be selectively coupled to any one array test signal line ATL. When an array test control signal ATGA corresponding to a gate-on voltage is supplied from the array test control line ATGL, the array tester 130 is turned on, and then outputs an array test signal ATD supplied from the array test signal line ATL to the data lines Dr[1] to Dr[M], Dg[1] to Dg[M], and Db[1] to Db[M].

In an example embodiment, the data distributor 150 may be coupled between the array tester 130 and the data lines Dr[1] to Dr[M], Dg[1] to Dg[M], and Db[1] to Db[M]. In an example embodiment, the data distributor 150 may include a plurality of switching elements SWd, each of which is turned on in response to any one of a plurality of control signals CLA, CLB, and CLC. In an example embodiment, the data distributor 150 may be implemented as a demultiplexer.

The panel tester 160 may include a plurality of switching elements coupled to second ends of the data lines Dr[1] to Dr[M], Dg[1] to Dg[M], and Db[1] to Db[M]. For example, the panel tester 160 may include first to sixth switching elements SW1 to SW6 respectively coupled to predetermined pixel columns. A plurality of lines coupled to the first to sixth switching elements SW1 to SW6, for example, first to seventh lines L1 to L7, are arranged around the panel tester 160.

In the present example embodiment, each of the first switching elements SW1 is coupled between any one of the data lines Dr[K] to Dr[K+L] of the first red pixels PXr1 and the first line L1. Also, the control electrodes (e.g., gate electrodes) of the first switching elements SW1 are coupled to the seventh line L7. The first switching elements SW1 are turned on when a panel test control signal TGA corresponding to a gate-on voltage is supplied through the seventh line L7, and then supply a first red test signal TDR1, supplied through the first line L1, to the data lines Dr[K] to Dr[K+L] of the first red pixels PXr1.

In the present example embodiment, each of the second switching elements SW2 is coupled between any one of the data lines Dr[1] to Dr[K−1] and Dr[K+L+1] to Dr[M] of the second red pixels PXr2 and the second line L2. Also, the control electrodes (e.g., gate electrodes) of the second switching elements SW2 are coupled to the seventh line L7. The second switching elements SW2 are turned on when the panel test control signal TGA corresponding to a gate-on voltage is supplied through the seventh line L7, and then supply a second red test signal TDR2, supplied through the second line L2, to the data lines Dr[1] to Dr[K−1] and Dr[K+L+1] to Dr[M] of the second red pixels PXr2.

In the present example embodiment, each of the third switching elements SW3 is coupled between any one of the data lines Dg[K] to Dg[K+L] of the first green pixels PXg1 and the third line L3. Also, the control electrodes (e.g., gate electrodes) of the third switching elements SW3 are coupled to the seventh line L7. The third switching elements SW3 are turned on when the panel test control signal TGA corresponding to a gate-on voltage is supplied through the seventh line L7, and then supply a first green test signal TDG1, supplied through the third line L3, to the data lines Dg[K] to Dg[K+L] of the first green pixels PXg1.

In the present example embodiment, each of the fourth switching elements SW4 is coupled between any one of the data lines Dg[1] to Dg[K−1] and Dg[K+L+1] to Dg[M] of the second green pixels PXg2 and the fourth line L4. Also, the control electrodes (e.g., gate electrodes) of the fourth switching elements SW4 are coupled to the seventh line L7. The fourth switching elements SW4 are turned on when the panel test control signal TGA corresponding to a gate-on voltage is supplied through the seventh line L7, and then supply a second green test signal TDG2, supplied through the fourth line L4, to the data lines Dg[1] to Dg[K−1] and Dg[K+L+1] to Dg[M] of the second green pixels PXg2.

In the present example embodiment, each of the fifth switching elements SW5 is coupled between any one of the data lines Db[K] to Db[K+L] of the first blue pixels PXb1 and the fifth line L5. Also, the control electrodes (e.g., gate electrodes) of the fifth switching elements SW5 are coupled to the seventh line L7. The fifth switching elements SW5 are turned on when the panel test control signal TGA corresponding to a gate-on voltage is supplied through the seventh line L7, and then supply a first blue test signal TDB1, supplied through the fifth line L5, to the data lines Db[K] to Db[K+L] of the first blue pixels PXb1.

In the present example embodiment, each of the sixth switching elements SW6 is coupled between any one of the data lines Db[1] to Db[K−1] and Db[K+L+1] to Db[M] of the second blue pixels PXb2 and the sixth line L6. Also, the control electrodes (e.g., gate electrodes) of the sixth switching elements SW6 are coupled to the seventh line L7. The sixth switching elements SW6 are turned on when the panel test control signal TGA corresponding to a gate-on voltage is supplied through the seventh line L7, and then supply a second blue test signal TDB2, supplied through the sixth line L6, to the data lines Db[1] to Db[K−1] and Db[K+L+1] to Db[M] of the second blue pixels PXb2.

The first line L1 may be coupled (or connected) between the first switching elements SW1 and a first pad TP1. The first line L1 transfers the first red test signal TDR1, supplied through the first pad TP1, to the first switching elements SW1. Thus, the first line L1 may be a first panel test signal line.

The second line L2 may be coupled (or connected) between the second switching elements SW2 and a second pad TP2. The second line L2 transfers the second red test signal TDR2, supplied through the second pad TP2, to the second switching elements SW2. Thus, the second line L2 may be a second panel test signal line.

The third line L3 may be coupled (or connected) between the third switching elements SW3 and a third pad TP3. The third line L3 transfers the first green test signal TDG1, supplied through the third pad TP3, to the third switching elements SW3. Thus, the third line L3 may be a third panel test signal line.

The fourth line L4 may be coupled (or connected) between the fourth switching elements SW4 and a fourth pad TP4. The fourth line L4 transfers the second green test signal TDG2, supplied through the fourth pad TP4, to the fourth switching elements SW4. Thus, the fourth line L4 may be a fourth panel test signal line.

The fifth line L5 may be coupled (or connected) between the fifth switching elements SW5 and a fifth pad TP5. The fifth line L5 transfers the first blue test signal TDB1, supplied through the fifth pad TP5, to the fifth switching elements SW5. Thus, the fifth line L5 may be a fifth panel test signal line.

The sixth line L6 may be coupled (or connected) between the sixth switching elements SW6 and a sixth pad TP6. The sixth line L6 transfers the second blue test signal TDB2, supplied through the sixth pad TP6, to the sixth switching elements SW6. Thus, the sixth line L6 may be a sixth panel test signal line.

The seventh line L7 may be coupled (or connected) between the control electrodes (e.g., gate electrodes) of the first to sixth switching elements SW1 to SW6 and a seventh pad TP7. The seventh line L7 transfers the panel test control signal TGA, supplied through the seventh pad TP7, to the first to sixth switching elements SW1 to SW6. Thus, the seventh line L7 may be a panel test control line.

A structure in which the first to seventh lines L1 to L7 are designed to pass through any one side of the panel 100, for example, the left side thereof, is illustrated in FIG. 10, but in other embodiments, for example, the first to seventh lines L1 to L7 may be designed to pass through both sides (e.g., left side and right side) of the panel 100 or, alternatively, the first to seventh lines L1 to L7 may be alternately arranged on different sides (e.g., left side and right side) of the panel 100.

In the present example embodiment, the first pad TP1 is coupled to the first line L1. The first pad TP1 transfers the first red test signal TDR1, supplied from outside (e.g., test equipment), to the first line L1.

In the present example embodiment, the second pad TP2 is coupled to the second line L2. The second pad TP2 transfers the second red test signal TDR2, supplied from outside (e.g., test equipment), to the second line L2.

In the present example embodiment, the third pad TP3 is coupled to the third line L3. The third pad TP3 transfers the first green test signal TDG1, supplied from outside (e.g., test equipment), to the third line L3.

In the present example embodiment, the fourth pad TP4 is coupled to the fourth line L4. The fourth pad TP4 transfers the second green test signal TDG2, supplied from outside (e.g., test equipment), to the fourth line L4.

In the present example embodiment, the fifth pad TP5 is coupled to the fifth line L5. The fifth pad TP5 transfers the first blue test signal TDB1, supplied from outside (e.g., test equipment), to the fifth line L5.

In the present example embodiment, the sixth pad TP6 is coupled to the sixth line L6. The sixth pad TP6 transfers the second blue test signal TDB2, supplied from outside (e.g., test equipment), to the sixth line L6.

In the present example embodiment, the seventh pad TP7 is coupled to the seventh line L7. The seventh pad TP7 transfers the panel test control signal TGA, supplied from outside (e.g., test equipment), to the seventh line L7.

In an example embodiment, at least one of the first to seventh lines L1 to L7 and the first to seventh pads TP1 to TP7 may remain on a final panel (e.g., the panel 100 of FIG. 2). For example, the first to seventh pads TP1 to TP7 may be provided in the pad unit 170. In other embodiments, at least one of the first to seventh lines L1 to L7 and the first to seventh pads TP1 to TP7 may be arranged outside of a final scribing line SCL, and may then be removed from the final panel (e.g., the panel 100' of FIG. 4) for which a scribing process is completely finished.

In the present example embodiment, the data lines Dr[K] to Dr[K+L], Dg[K] to Dg[K+L], and Db[K] to Db[K+L], which are coupled to the first pixels PXA present in at least the first zone ZONE A, and the data lines Dr[1] to Dr[K−1], Dr[K+L+1] to Dr[M], Dg[1] to Dg[K−1], Dg[K+L+1] to Dg[M], Db[1] to Db[K−1], and Db[K+L+1] to Db[M], which are coupled to the second pixels PXB present in the second zone ZONE B, may be coupled to different panel test signal lines L1 to L6 through different switching elements SW1 to SW7.

For example, the data lines Dr[K] to Dr[K+L] of K-th to (K+L)-th red pixels PXr1 in the I-th horizontal line located in at least the first zone ZONE A may be coupled to the first line L1 through the first switching elements SW1, and the data lines Dr[1] to Dr[K−1] and Dr[K+L+1] to Dr[M] of at least some of the remaining red pixels PXr2 in the I-th horizontal line may be coupled to the second line L2 through the second switching elements SW2. Similarly, the data lines Dg[K] to Dg[K+L] and the data lines Db[K] to Db[K+L] of the K-th to (K+L)-th green and blue pixels PXg1 and PXb1 in the I-th horizontal line may be coupled to the third line L3 and the fifth line L5, respectively, through the third switching elements SW3 and the fifth switching elements SW5. The data lines Dg[1] to Dg[K−1] and Dg[K+L+1] to Dg[M] and the data lines Db[1] to Db[K−1] and Db[K+L+1] to Db[M] of at least some of the remaining green and blue pixels PXg2 and PXb2 in the I-th horizontal line may be coupled to the fourth line L4 and the sixth line L6, respectively, through the fourth switching elements SW4 and the sixth switching elements SW6.

In accordance with the above-described embodiment, the first pixels PXA may be driven at the grayscale level differing from that of the second pixels PXB arranged in the same horizontal line as that of the first pixels PXA during each horizontal period in which the first pixels PXA in the first zone ZONE A are driven even in a state in which a data driver is not mounted. Accordingly, even in a panel test ST4 conducted before a module process ST5, additional factors that may influence the luminance of the pixels PXA and PXB (e.g., variations in the characteristics of thin film transistors and/or voltage drop differences caused by an RC delay) may be maximally excluded, and characteristic variations attributable to the degradation of organic light emitting diodes EL may be more precisely detected.

Figure 11:
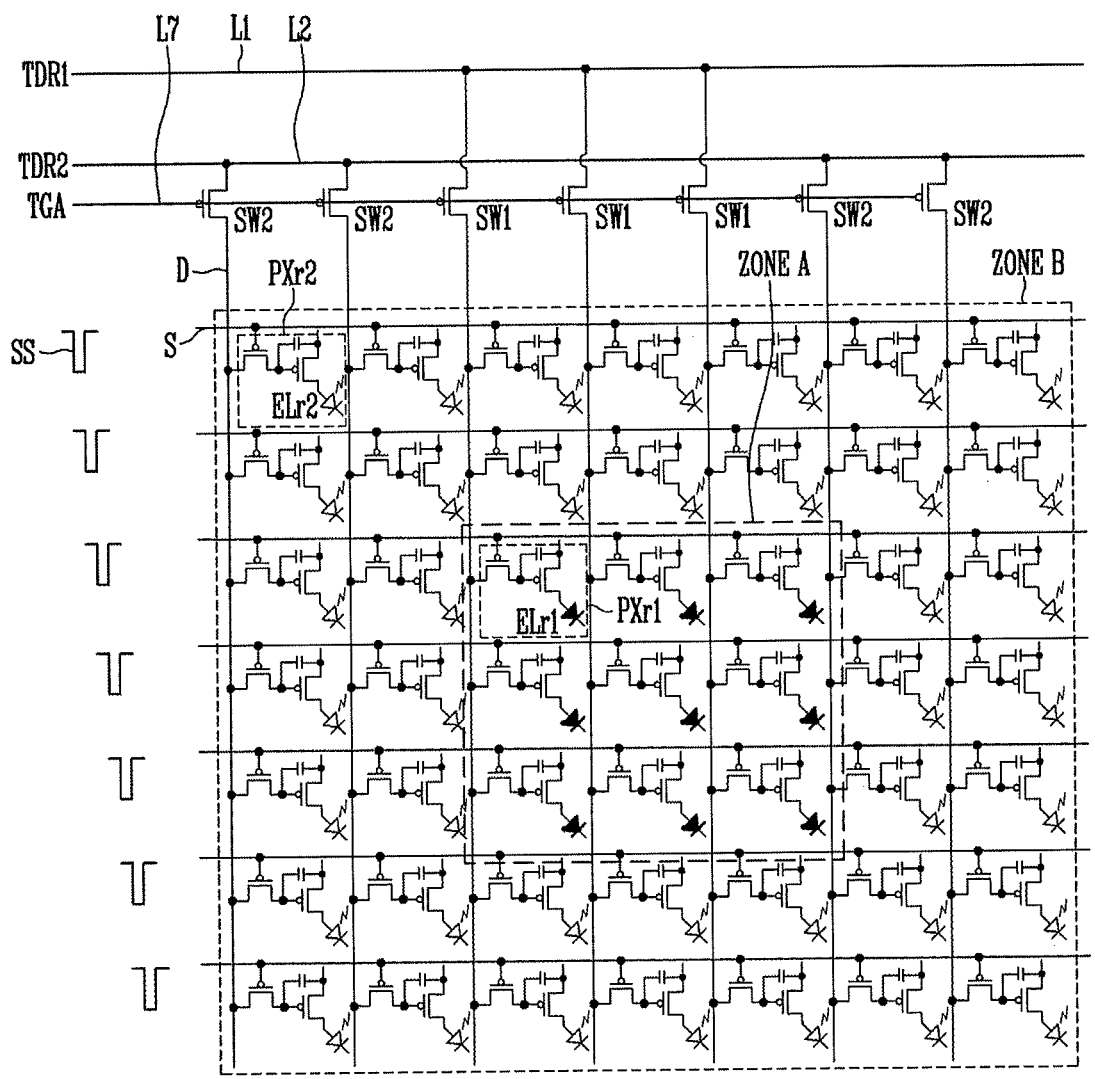
FIG. 11 illustrates a diagram of a coupling structure between the pixel array and a lighting test circuit and a method of testing the degradation characteristics of an organic light emitting display device using the coupling structure, based on red pixels illustrated in FIG. 10.

FIG. 11 illustrates a diagram of a coupling structure between a pixel array and a lighting test circuit and a method of testing degradation characteristics of an organic light emitting display device using the coupling structure, based on red pixels illustrated in FIG. 10. For convenience of description, structures or the like of respective pixels are simplified and illustrated in FIG. 11.

Referring to FIG. 11, in a panel test ST4, for example, a degradation characteristic test and/or lifespan evaluation stage for organic light emitting diodes ELr1 and ELr2, first and second red test signals TDR1 and TDR2 are respectively supplied to first and second red pixels PXr1 and PXr2 using first and second switching elements SW1 and SW2 while scan signals SS are sequentially supplied to scan lines S. In an example embodiment, a first zone ZONE A and a second zone ZONE B are driven at different grayscale levels at least while a predetermined test pattern is displayed during the corresponding test period.

For example, during each horizontal period in which the first red pixels PXr1 in the first zone ZONE A and the second red pixels PXr2 in the second zone ZONE B are selected together, a first red test signal TDR1 having a first grayscale level (e.g., black grayscale level) may be supplied to the first line L1, and a second red test signal TDR2 having a second grayscale level (e.g., white grayscale level) may be supplied to the second line L2. Accordingly, during the period in which the test pattern is displayed, the first red pixels PXr1 may be maintained in a non-emissive state, and the second red pixels PXr2 may be maintained in an emissive state (e.g., the state of maximum emission).

During each horizontal period in which horizontal lines in which only the second red pixels PXr2 in the second zone ZONE B are arranged are driven, the first and second red test signals TDR1 and TDR2 having the second grayscale level (e.g., white grayscale level) may be supplied to both the first and second lines L1 and L2. Accordingly, during the corresponding test period, the state of maximum emission may be entirely maintained in the second zone ZONE B.

Through the above-described method, the first and second green pixels PXg1 and PXg2 and the first and second blue pixels PXb1 and PXb2 may be driven. Therefore, during the period in which a predetermined test pattern is displayed, the first pixels PXA in the first zone ZONE A may entirely represent a black grayscale level, and the second pixels PXB in the second zone ZONE B may entirely represent a white grayscale level. As a result, a test pattern in which different grayscale levels are represented for respective areas along at least a first direction (i.e., X direction) may be displayed.

Figure 12:
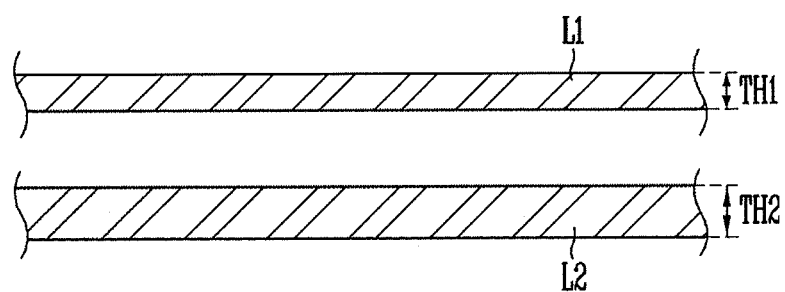
FIG. 12 illustrates portions of first and second lines illustrated in FIG. 11.

FIG. 12 illustrates portions of first and second lines illustrated in FIG. 11. In FIG. 12, an embodiment in which first and second lines have different thicknesses is illustrated, as an example.

Referring to FIGS. 11 and 12, different numbers of first and/or second red pixels PXr1 and PXr2 may be coupled to first and second lines L1 and L2, respectively. For example, the number of first and second red pixels PXr1 and PXr2 coupled to the first line L1 may be less than the number of second red pixels PXr2 coupled to the second line L2. The thickness TH1 (width and/or thickness) of the first line L1 may be less than the thickness TH2 of the second line L2. For example, the thicknesses TH1 and TH2 of the first and second lines L1 and L2 may be set to different values so that RC delay variations between the first and second lines L1 and L2 may be compensated for. In accordance with the above-described embodiment, more precise test results may be obtained when a panel test ST4 is conducted.

Figure 13:
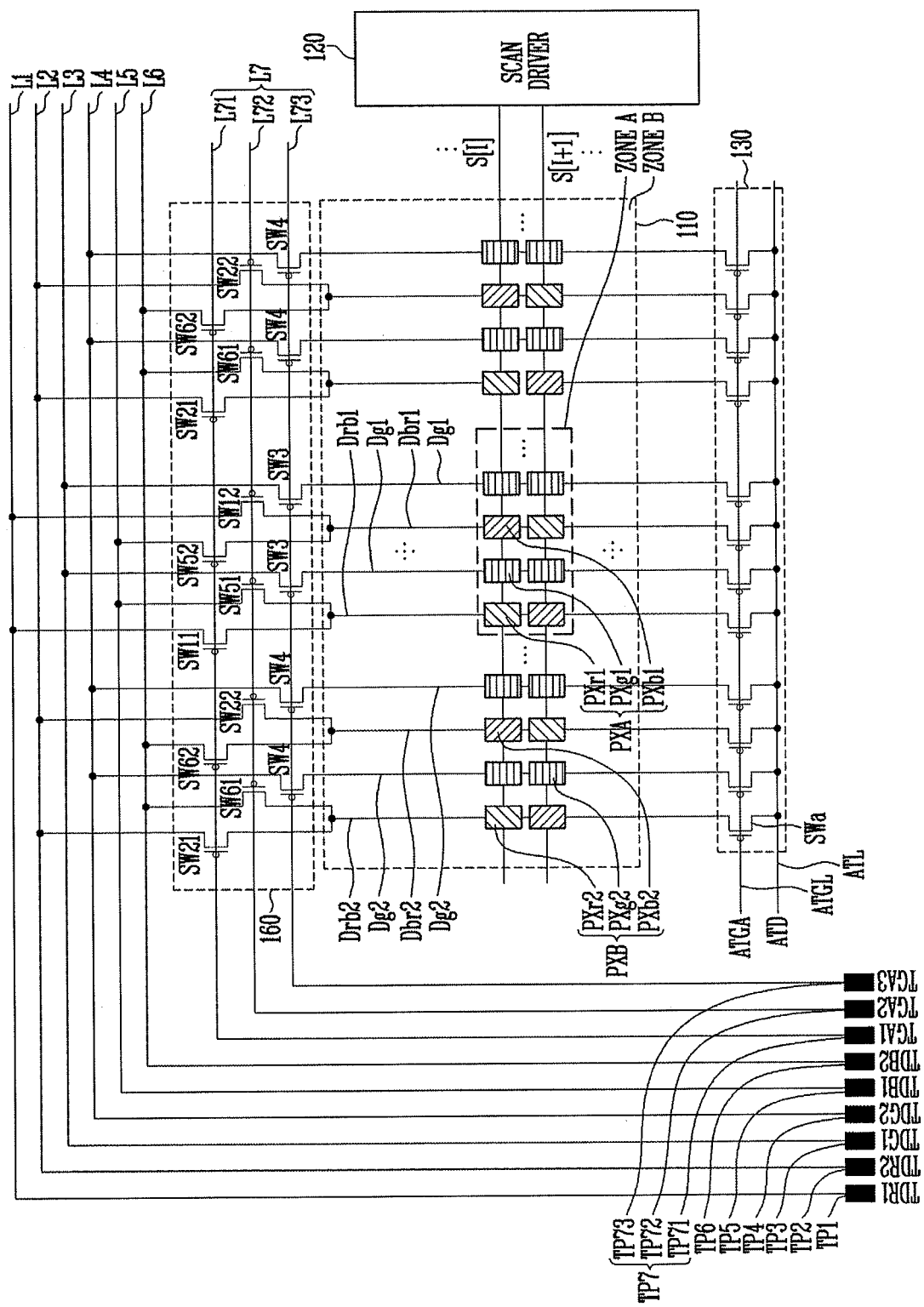
FIG. 13 illustrates a diagram of a pixel array and testers according to an example embodiment.

FIG. 13 illustrates a diagram of a pixel array and testers according to an example embodiment. In FIG. 13, an embodiment in which the above-described data distributor 150 is not provided is illustrated. In FIG. 13, the same reference numerals are used to designate components similar or identical to those in FIG. 10, and a detailed description of the components will be omitted.

Referring to FIG. 13, a pixel array 110 may include a plurality of first and second pixels PXA and PXB which are arranged in a pentile type. For example, the pixel array 110 may include first pixel columns (e.g., first vertical pixel columns) in which red pixels PXr1 and PXr2 and blue pixels PXb1 and PXb2 are alternately arranged along the extension direction of data lines Dr[1] to Dr[M], Dg[1] to Dg[M], and Db[1] to Db[M] (i.e., Y direction), second pixel columns (e.g., second vertical pixel columns) which are arranged adjacent to the first pixel columns and in which green pixels PXg1 and PXg2 are successively arranged, third pixel columns (e.g., third vertical pixel columns) which are arranged adjacent to the second pixel columns and in which the red pixels PXr1 and PXr2 and the blue pixels PXb1 and PXb2 are alternately arranged in a sequence opposite to that of the first pixel columns, and fourth pixel columns (e.g., fourth vertical pixel columns) which are arranged adjacent to the third pixel columns and in which the green pixels PXg1 and PXg2 are successively arranged. In this way, pixel column groups composed of first to fourth pixel columns may be repeatedly arranged in the pixel array 110.

In the present embodiment, a seventh line L7 set to a panel test control line may be separated into first to third test control lines L71, L72, and L73. Further, a seventh pad TP7 may be separated into 71-th to 73-th control pads TP71 to TP73 that are coupled to the first to third test control lines L71, L72, and L73, respectively. The 71-th to 73-th control pads TP71 to TP73 transfer first to third test control signals TGA1, TGA2, and TGA3, which are externally supplied, to the first to third test control lines L71, L72, and L73, respectively.

For example, the first test control line L71 may be coupled in common to the control electrodes of first and second switching elements SW11 and SW21 coupled to the first pixel columns and to the control electrodes of fifth and sixth switching elements SW52 and SW62 coupled to the third pixel columns. When a first test control signal TGA1 corresponding to a gate-on voltage is applied to the first test control line L71, the switching elements SW11, SW21, SW52, and SW62 coupled to the first test control line L71 are turned on. Accordingly, the first or second blue test signal TDB1 or TDB2 is supplied to respective data lines Dbr1 and Dbr2 of the third pixel columns while the first or second red test signal TDR1 or TDR2 is supplied to respective data lines Drb1 and Drb2 of the first pixel columns.

The second test control line L72 may be coupled in common to the control electrodes of the fifth and sixth switching elements SW51 and SW61 coupled to the first pixel columns and to the control electrodes of the first and second switching elements SW12 and SW22 coupled to the third pixel columns. When a second test control signal TGA2 corresponding to a gate-on voltage is supplied to the second test control line L72, the switching elements SW12, SW22, SW51, and SW61 coupled to the second test control line L72 are turned on. Accordingly, the first or second red test signal TDR1 or TDR2 is supplied to respective data lines Dbr1 and Dbr2 of the third pixel columns while the first or second blue test signal TDB1 or TDB2 is supplied to respective data lines Drb1 and Drb2 of the first pixel columns.

In an example embodiment, at least the first and second test control signals TGA1 and TGA2 may be supplied at different times. For example, the first and second test control signals TGA1 and TGA2 may be alternately supplied.

The third test control line L73 may be coupled in common to the control electrodes of the third and fourth switching elements SW3 and SW4 coupled to the second and fourth pixel columns. When a third test control signal TGA3 corresponding to a gate-on voltage is supplied to the third test control line L73, the switching elements SW3 and SW4 coupled to the third test control line L73 are turned on. Accordingly, the first or second green test signal TDG1 or TDG2 is supplied to respective data lines Dg1 and Dg2 of the second and fourth pixel columns.

In accordance with the above-described embodiment, a predetermined test pattern may be displayed using the panel tester 160 in a state in which a data driver is not mounted, even on the panel 100 or 100' to which the pentile structure is applied. Accordingly, the degradation characteristics (or lifespan characteristics) of organic light emitting diodes EL may be effectively detected.

Figure 14:
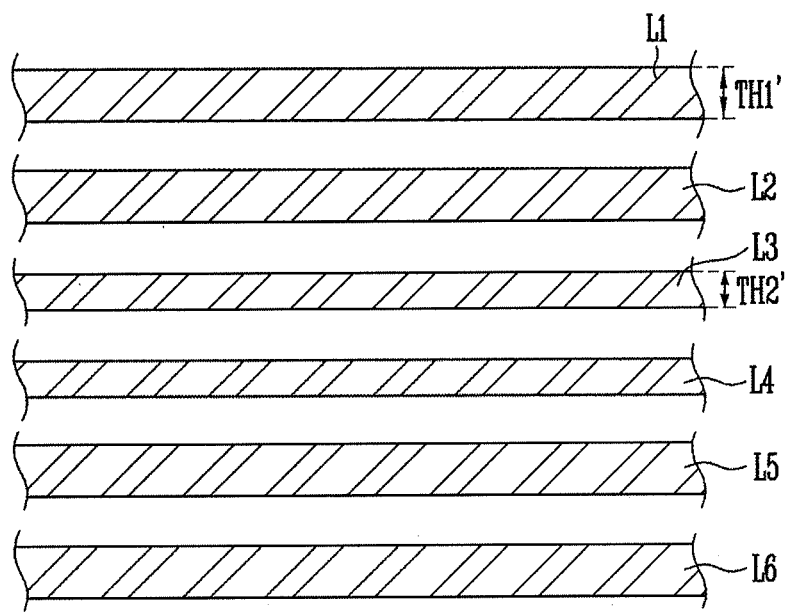
FIG. 14 illustrates portions of first to sixth lines illustrated in FIG. 13.

FIG. 14 illustrates portions of first to sixth lines illustrated in FIG. 13.

Referring to FIGS. 13 and 14, respective data lines Drb1, Dbr1, Drb2, and Dbr2 of first and third pixel columns may alternately receive a red test signal TDR1 or TDR2 and a blue test signal TDB1 or TDB2 in response to first and second test control signals TGA1 and TGA2. In contrast, respective data lines Dg1 and Dg2 of second and fourth pixel columns may continuously receive a first or second green test signal TDG1 or TDG2. Therefore, a relatively large RC delay may occur in the data lines Drb1, Dbr1, Drb2, and Dbr2 of the first and third pixel columns, compared to the data lines Dg1 and Dg2 of the second and fourth pixel columns.

Therefore, in an example embodiment, respective thicknesses TH1' of the first, second, fifth, and sixth lines L1, L2, L5, and L6 coupled to the data lines Drb1, Dbr1, Drb2, and Dbr2 of the first and third pixel columns may be set to values greater than respective thicknesses TH2' of the third and fourth lines L3 and L4 coupled to the data lines Dg1 and Dg2 of the second and fourth pixel columns. Accordingly, RC delay variations that may occur in the data lines Drb1, Dg1, Dbr1, Drb2, Dg1, and Dbr2 may be compensated for, and thus more precise test results may be obtained in a panel test ST4.

Further, in an example embodiment, a space occupied by first to seventh lines L1 to L7 may be minimized by applying a design scheme or the like for reducing intervals between the first to seventh lines L1 to L7.

By way of summation and review, an organic light emitting diode may be degraded as it is used for a long time, and thus the characteristics of the organic light emitting diode may change. For example, with the lapse of time, the luminance characteristics of the organic light emitting diode may be deteriorated while the emission efficiency thereof is degraded.

As described above, embodiments may provide an organic light emitting display device and a method of testing the organic light emitting display device that may efficiently detect the degradation characteristics of an organic light emitting diode.

In an embodiment, the degradation characteristics of an organic light emitting diode may be efficiently detected. For example, the degradation characteristics of an organic light emitting diode may be effectively detected even in a state in which a data driver is not mounted, and thus the manufacturing efficiency of an organic light emitting display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of testing an organic light emitting display device, the method comprising:
    displaying a predetermined test pattern by driving pixels present in first and second zones at different grayscale levels during a predetermined test period in a state in which a data driver is not mounted on the organic light emitting display device;
    measuring luminance values of the first and second zones while driving the pixels present in the first and second zones at an identical grayscale level; and
    detecting degradation characteristics of an organic light emitting diode using the luminance values of the first and second zones wherein
    the predetermined test pattern is provided to the organic light emitting display device by a testing device external to the organic light emitting display device.

2. The method as claimed in claim 1, wherein, during a period in which the test pattern is displayed, a test signal having a first grayscale level is supplied to the pixels present in the first zone, and a test signal having a second grayscale level is supplied to the pixels present in the second zone.

3. The method as claimed in claim 2, wherein the first grayscale level is a black grayscale level, and the second grayscale level is a white grayscale level.

4. The method as claimed in claim 1, wherein
    during each horizontal period in which the pixels present in the first and second zones are selected together in a period in which the test pattern is displayed,
    a test signal having a first grayscale level is supplied to first color pixels present in the first zone through a first line and first switching elements, and
    a test signal having a second grayscale level is supplied to first color pixels present in the second zone through a second line and second switching elements during the horizontal periods.

5. The method as claimed in claim 1, wherein, during a period in which the test pattern is displayed, all of the pixels present in the first zone do not emit light, and all of the pixels present in the second zone emit light.

6. The method as claimed in claim 1, wherein the first zone and the second zone each include a plurality of pixels.

7. The method as claimed in claim 6, wherein detecting the degradation characteristics of the organic light emitting diode includes comparing a luminance value of the first zone to a luminance value of the second zone.

8. The method as claimed in claim 7, wherein the second zone occupies a region of a display area that does not overlap a region occupied by the first zone of the display area.

9. The method as claimed in claim 6, wherein the second zone occupies a region of a display area that does not overlap a region occupied by the first zone of the display area.

10. The method as claimed in claim 1, wherein the pixels are divided into the first and second zones in a direction in which a plurality of scan lines extend.

11. The method as claimed in claim 10, wherein the displaying the predetermined test pattern performs at least one of eliminating variations of thin film transistors of the data driver and eliminating voltage drop differences of the data driver.

* * * * *